United States Patent [19]

Aoyama et al.

[11] Patent Number: 4,520,041

[45] Date of Patent: May 28, 1985

[54] METHOD FOR FORMING METALLIZATION STRUCTURE HAVING FLAT SURFACE ON SEMICONDUCTOR SUBSTRATE

[75] Inventors: Masaharu Aoyama, Fujisawa; Masahiro Abe, Yokohama; Takashi Ajima, Kamakura; Toshio Yonezawa, Yokosuka, all of Japan

[73] Assignee: Tokyo Shibaura Denki Kabushiki Kaisha, Japan

[21] Appl. No.: 548,440

[22] Filed: Nov. 3, 1983

[30] Foreign Application Priority Data

Nov. 4, 1982 [JP] Japan .................................. 57-192491

[51] Int. Cl.³ .................. H01L 21/283; H01L 21/302
[52] U.S. Cl. ...................................... 427/88; 156/643; 156/656; 427/89; 427/90
[58] Field of Search ................ 427/89, 88, 90; 156/643, 656

[56] References Cited

U.S. PATENT DOCUMENTS 4,025,411  5/1977  Hom-Ma ............................ 156/643

FOREIGN PATENT DOCUMENTS 51-44871  12/1976  Japan .
57-56948   4/1982  Japan .

*Primary Examiner*—John D. Smith
*Attorney, Agent, or Firm*—Finnegan, Henderson, Farabow, Garrett & Dunner

[57] ABSTRACT

A metallization structure having a substantially flat surface can be formed on a semiconductor substrate by forming first and second insulating layers on the substrate. The second insulating layer is selectively removed to form grooves therein. Then, a metallic material layer is conformably formed. The metallic layer has grooves corresponding to the grooves of the second insulating layer. A flowable polymer is applied to the surface of the resultant structure to form a layer having a flat surface. The polymer layer and the metallic layer are sequentially ion-etched to expose the second insulating layer. Thus, the metallization structure constituted by the remaining metallic layer and the second insulating layer is formed to have a flat surface.

9 Claims, 11 Drawing Figures

F I G. 2A
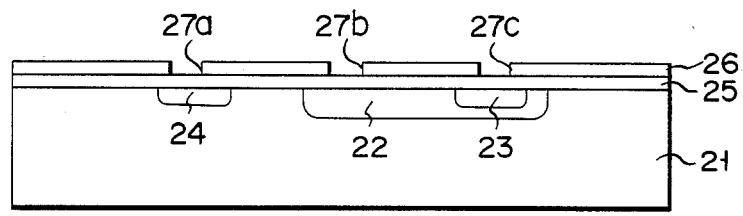
F I G. 2B
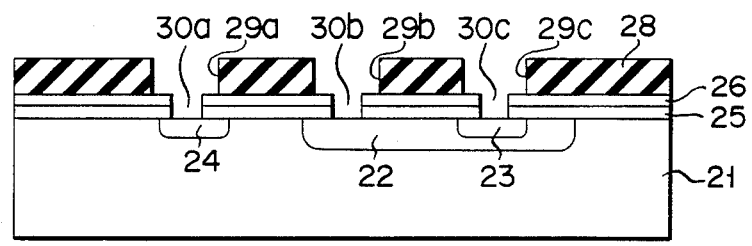
F I G. 2C
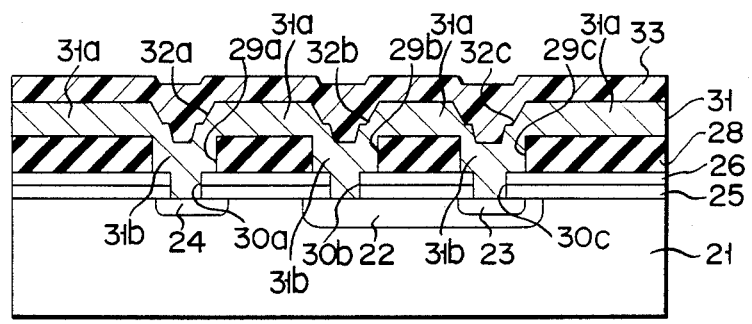

4,520,041

METHOD FOR FORMING METALLIZATION STRUCTURE HAVING FLAT SURFACE ON SEMICONDUCTOR SUBSTRATE

BACKGROUND OF THE INVENTION

1. Field of the Invention

The present invention relates to a method for manufacturing a semiconductor device and, more particularly, to a method for forming a metallization structure having a substantially flat surface on a semiconductor substrate.

2. Description of the Prior Art

The packing density of semiconductor devices such as integrated circuits has been progressively increasing. For this purpose, the packing density of the metallization layer must be inevitably increased. For example, circuit elements formed in a semiconductor substrate often have only a low packing density when observed after the metallization layer is removed. This is because the packing density of the metallization layer is low, so the packing density of the semiconductor elements also becomes low.

The packing density of the metallization layer can be greatly improved by forming the metallization layer into a multi-layered structure in addition to micropatterning thereof.

In order to form a multi-layered metallization structure, metallization layers on the underlying metallization layers must not be disconnected at stepped portions. For this purpose, the underlying layer is tapered or an insulating interlayer has a slope in a sharp step of the underlying layer. In order to micropattern the metallization layer and obtain a multi-layered metallization structure, it is desired that the metallization layer and insulating layer be formed into a structure having a flat surface.

The present invention is mainly concerned with flattening of the metallization structure.

In a conventional method, anodic oxidation is utilized to form a metallization layer having a flat surface. According to this method, a metal layer is partially converted to an oxide by anodic oxidation. A remaining metal portion which is not oxidized constitutes an interconnection layer. According to this method, a height of a step is decreased as compared with the interconnection layer formed by etching. However, when a stepped portion is present in the underlying layer, the metal layer is abnormally oxidized at its portion corresponding to such a stepped portion, resulting in disconnection of the resultant interconnection layer. Alternatively, the metal is partially left nonoxidized depending on the interconnection layer pattern to be formed. Metals suitable for anodic oxidation are limited to aluminum, alloys thereof, and tantalum.

Another method for forming a flat metallization structure is described in Japanese patent publication No. 51-44871 published on Dec. 1, 1976. According to this method, a thermosetting resin film such as polyimide resin film is used as an insulating interlayer. This method includes the step of forming a polyimide resin film to cover the entire surface of a semiconductor substrate having a first metallization layer thereon. A contact hole is formed in the polyimide resin film by using a proper mask. After the mask is removed, a second metallization layer is formed on the polyimide resin film. According to this method, the polyimide resin covers the first metallization layer projected on the surface of the semiconductor substrate. Therefore, at an intersection between the first and second metallization layers through the polyimide resin film, substantially no stepped portion is formed. Therefore, according to this method, a multi-layered metallization structure having a substantially flat surface can be formed.

However, according to the above method, since some polyimide resin remains as an insulating layer in the final semiconductor product, some problems are presented. First, the polyimide resin is hygroscopic, so that a semiconductor device encapsulated in a compact plastic package has low resistance to moisture. Second, the polyimide resin tends to be polarized by a bias voltage applied to the semiconductor device. As a result, the electrical characteristics of the semiconductor device tend to vary, thus degrading operation reliability.

SUMMARY OF THE INVENTION

It is, therefore, an object of the present invention to eliminate the conventional drawbacks and to provide a method for forming a metallization structure having a substantially flat surface.

The method of the present invention includes the step of forming a first insulating layer on a semiconductor substrate and having at least one opening exposing at least one semiconductor region formed in the semiconductor substrate, and forming a second insulating layer to cover the entire surface of the resultant structure. At least one groove is formed in the second insulating layer. This groove has a bottom which communicates with an opening of the first insulating layer. A metallic material layer is formed to cover the entire surface of the resultant structure so as to fill both the groove of the second insulating layer and the opening of the first insulating layer with the wiring material layer. The metallic material layer has a surface corresponding to the groove of the second insulating layer. An organic polymeric material having good flowability is applied to the entire surface of the resultant structure so as to fill the recess of the metallic material layer with the polymeric material. Finally, the polymeric material layer and the metallic material layer are subsequently etched by plasma ion etching along the direction of thickness thereof until the second insulating layer is exposed. As a result, the metallic material layer is left only in the groove of the second insulating layer. The metallization layer comprising the remaining metallic material is surrounded by the second insulating layer and has substantially the same surface level as that of the second insulating layer, thereby obtaining a metallization structure having a continuous surface with substantially no steps.

BRIEF DESCRIPTION OF THE DRAWINGS

FIGS. 2A to 2E show a detailed example of the method of the present invention.

DETAILED DESCRIPTION OF THE PREFERRED EMBODIMENTS

The basic steps of the method of the present invention will be described with reference to FIGS. 1A to 1F.

Figure 1A:
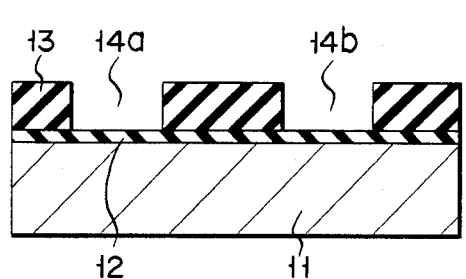
FIGS. 1A to 1F are sectional views showing the basic steps of forming a metallization structure according to the present invention.

As shown in FIG. 1A, a first insulating layer 12 is formed on a semiconductor substrate 11 having predetermined semiconductor regions (not shown). The insulating layer 12 has contact holes (not shown) through which the semiconductor regions are exposed. A second insulating layer 13 is formed on the first insulating layer 12. Grooves 14a and 14b having the same pattern as the prospective interconnection layer pattern are formed in the second insulating layer 13. The grooves 14a and 14b have the first insulating layer 12 as a bottom portion thereof. The grooves 14a and 14b are formed to align with the bottom portion of the contact hole of the first insulating layer 12.

Figure 1D:
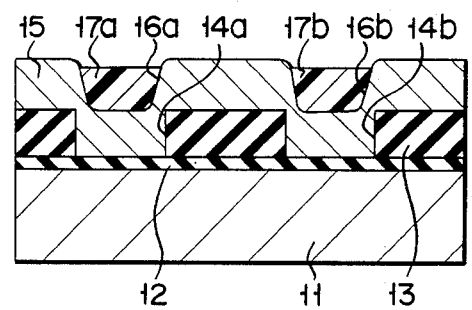
Figure 1B:
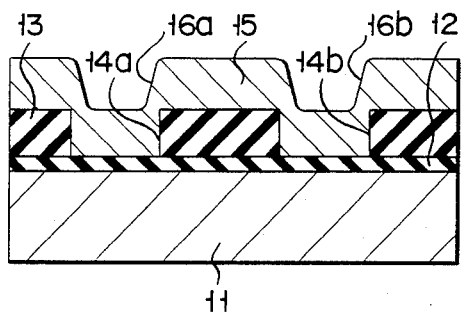

A continuous metallic material layer 15 is conformably formed by vacuum-evaporation or sputtering on the entire surface of the structure of FIG. 1A, as shown in FIG. 1B. The metallic material layer 15 is formed on the second insulating layer 13 and is filled in the grooves 14a and 14b. The metallic material layer 15 has grooves 16a and 16b corresponding to the grooves 14a and 14b, respectively.

An organic polymeric material exhibiting flowability is applied to the metallic material layer 15 to form a layer 17. In this case, the polymeric material is filled in the grooves 16a and 16b due to its flowability. Portions of the layer 17, which correspond to the grooves 16a and 16b are thicker than the remaining portion thereof. The surface of the layer 17 becomes substantially flat.

Figure 1E:
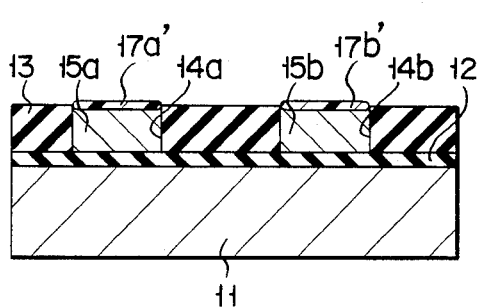
Figure 1C:
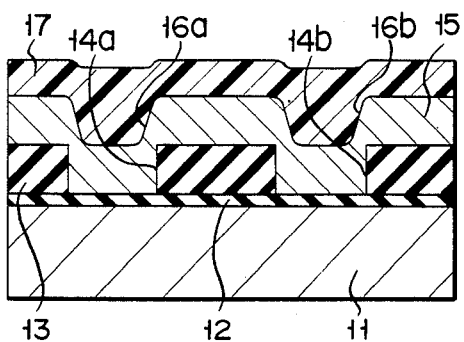

The polymeric material layer 17 and the metallic material layer 15 are etched by plasma ion etching along the direction of thickness thereof in the order named. When the polymeric material layer 17 is etched until a portion of the metallic material layer 15 which is formed on the second insulating layer 13 is exposed, portions 17a and 17b of the polymeric material layer 17 are left in the grooves 16a and 16b of the metallic material layer 15, respectively, as shown in FIG. 1D. Etching further advances to remove the metallic material layer 15 and the remaining portions 17a and 17b of the polymeric material layer 17 until the second insulating layer 13 is exposed. As a result, portions 15a and 15b of the metallic material layer 15 are left only in the grooves 14a and 14b of the second insulating layer 13, respectively (FIG. 1E). When a polymer having an etching rate lower than that of the metallic material, portions (17'a and 17'b) of the polymer layer 17 are slightly left on the portions 15a and 15b. In order to remove these portions, ion etching is performed. Alternatively, these portions 17'a and 17'b can be removed by an oxygen plasma.

Figure 1F:
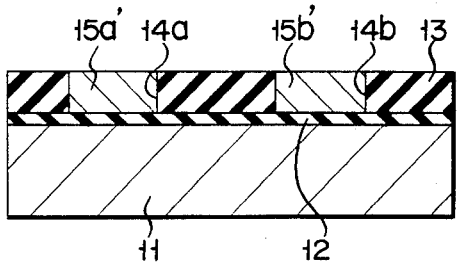

As shown in FIG. 1F, metallization layers 15'a and 15'b comprising the remaining metallic material and surrounded by the second insulating layer 13 are obtained. The level of the surfaces of the layers 15'a and 15'b is substantially the same as that of the second insulating layer 13 surrounding the layers 15'a and 15'b. Thus, a metallization structure comprising the layers 15'a and 15'b and the second insulating layer 13 can be formed to have a substantialy flat surface.

The layers 15'a and 15'b constituting metallization layers have the same surface level as that of the second insulating layer 13. When additional first and second insulating layers are formed under the second metallization layer, the third metallization layer, and so on, a multi-layered metallization structure can be obtained.

The first insulating layer 12 can comprise silicon oxide film or a two-layered structure composed of a silicon oxide film and a silicon nitride film formed thereon. The second insulating layer can comprise a silicon oxide film or the like. More preferably, the second insulating layer comprises a material such as phosilicate glass which reduces stress in the semiconductor device.

The metallic material is not limited to a particular material but can comprise any material used for an interconnection or wiring layer of the semiconductor device. Examples of the metallic material include aluminum and alloys thereof (e.g., Al-Si alloy); noble metals such as gold and platinum; tungsten; molybdenum; titanium; nickel and the like. The metallic material is preferably selected from the group consisting of aluminum and alloys thereof, and noble metals such as platinum and gold. The metallization layer may comprise a laminated structure of these metallic materials.

The organic polymeric material preferably includes polyimide resin and a photoresist material. Since the polymeric material is used to form the layer 17 which is filled in the grooves 16a and 16b of the metallic material layer 15 and which has a substantially flat surface, the organic polymeric material must have proper flowability when it is applied. Proper flowability can be obtained by dissolving the polymeric material in a solvent. The polymeric material is preferably applied by spin coating. After the polymeric material is applied, it is hardened by heating or the like.

The organic polymeric material layer 17 and the metallic material layer 15 are etched by nonreactive ions including those of argon, xenon, neon or nitrogen. This nonreactive ion etching removes the organic material and the metallic material at substantially the similar rate.

The present invention will be described more in detail with reference to FIGS. 2A to 2E.

As shown in FIG. 2A, a silicon oxide film 25 having a thicknes of 0.1 $\mu$m and a silicon nitride film 26 having a thickness of 0.5 $\mu$m are sequentially formed on a silicon substrate 21. A p$^+$-type region 22, an n$^+$-type region 23 formed in the p$^+$-type region 22, and an n$^+$-type region 24 formed outside the p$^+$-type region 22 are formed in the surface layer of the silicon substrate 21 in a coplanar manner. Portions of the silicon nitride film 26 which correspond to the regions 22, 23 and 24 are etched to form openings 27a, 27b and 27c partially exposing the silicon oxide film 25.

A phosphosilicate glass (PSG) layer 28 is deposited by chemical vapor deposition on the structure of FIG. 2A at a temperature of, e.g., 500° C. to a thickness of, e.g., 1 $\mu$m. Portions of the PSG layer 28 including the portions corresponding to the openings 27a, 27b and 27c are selectively removed in accordance with the metallization layer pattern to be formed. As a result, grooves 29a, 29b and 29c are formed in the PSG layer 28, and the openings 27a, 27b and 27c of the silicon nitride film 26 are exposed at the bottoms of the grooves 29a, 29b and 29c, respectively. The silicon oxide film 25 is selectively removed through the openings 27a, 27b and 27c using the exposed portion of the silicon nitride film 26 as a mask. As a result, contact holes 30a, 30b and 30c which partially expose the semiconductor regions 22, 23 and 24 are formed in the insulating layer consisting of the silicon oxide film and silicon nitride film (FIG. 2B).

Subsequently, an aluminum-1% silicon alloy is deposited by sputtering to cover the entire surface of the structure of FIG. 2B to a thickness of, e.g., 1.0 $\mu$m, thereby forming a metallic material layer 31. Thereafter, a positive photoresist layer 33 is formed on the metallic material layer 31 (FIG. 2C). The layer 31 has grooves 32a, 32b and 32c respectively corresponding to the grooves 29a, 29b and 29c of the PSG layer 28. Since the photoresist material exhibits flowability, the photoresist material is filled in the grooves of the metallic material layer 31. Thus, portions of the photoresist film which correspond to the grooves are thicker than the remaining portion thereof corresponding to the PSG layer 28. For example, when a photoresist material having a viscosity of 15 centipoises is applied by spin coating at a speed of 5,000 rpm, the photoresist film portion corresponding to a projecting portion 31a of the metallic material layer 31 has a thickness of about 0.7 $\mu$m, and other portion 31b thereof corresponding to the grooves 29a, 29b and 29c each having a depth of 1 $\mu$m has a thickness of about 1.3 $\mu$m.

Figure 2D:
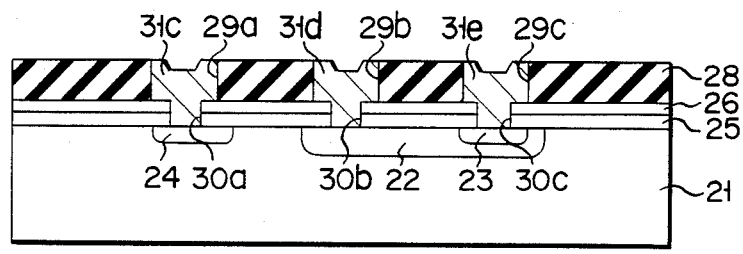

The structure shown in FIG. 2C is placed in a vacuum chamber, and etching is performed by argon ions. The photoresist layer 33 and the metallic material layer 31 are etched at etching rates of about 350 Å/mm and about 600 Å/mm, respectively, by using an ion beam having a current density of about 1 mA/cm$^3$ at an acceleration voltage of 600 eV. In this case, it takes about 40 minutes to remove the projecting portion 31a on the PSG layer 28 completely and to almost remove the photoresist film on a remaining metallic material layer portion 31a. The photoresist layer portion slightly remaining on the projecting portion 31a, if present, is removed by an oxygen plasma. As a result, the metallization layers respectively formed of layers 31c, 31d and 31e which have substantially the same surface level as that of the PSG layer 28 are formed. The side surfaces of the layers 31c, 31d and 31e are surrounded by the PSG layer 28 (FIG. 2D). The metallization layers contact the semiconductor regions 22, 23 and 24 through the contact holes 30a, 30b and 30c formed in the insulating layer 25, 26.

Figure 2E:
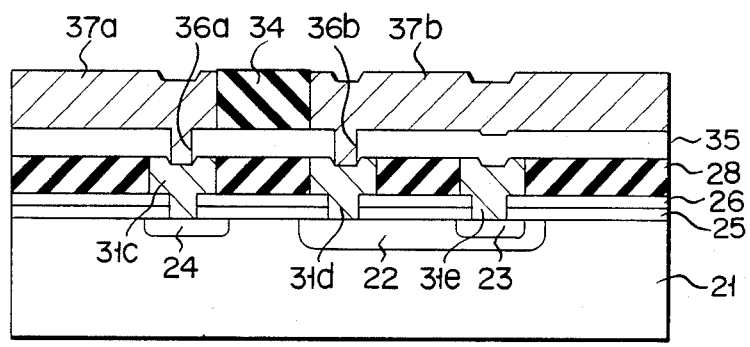

An insulating interlayer comprising a silicon oxide film and/or a silicon nitride film, a PSG layer (to form a spacer among metallization layers), and a metallic material layer are similarly formed on the structure shown in FIG. 2D, and the resultant structure is similarly ion-etched to form metallization layers 37a and 37b which contact the metallization layers 31c and 31d respectively through contact holes 36a and 36b formed in the insulating layer 35 (FIG. 2E). The metallization layers 37a and 37b have their sides contacted or surrounded by the PSG layer 34. The second metallization layers 37a and 37b are formed to cross the first metallization layers 31c, 31d and 31e with the insulating layer 35 intervening therebetween.

According to the present invention as described above, the metallization layer is surrounded by the insulating layer such that the metallization layer is level with the insulating layer, thereby forming an metallization structure having a substantially flat surface. Even if the second metallization layer, the third metallization layer, and so on, are formed in the same manner as described above, a multi-layered metallization structure can be formed without breakage at the metallization layer. In addition to this advantage, the polymeric material is not present in the metallization structure, so hygroscopic defects and degradation of electrical characteristics of the semiconductor device will not occur.

What is claimed is:

1. A method for forming a metallization structure having a substantially flat surface on a semiconductor substrate, comprising the steps of:

forming a first insulating layer on said semiconductor substrate which has at least one semiconductor region formed therein, said first insulating layer having at least one contact hole through which said at least one semiconductor region is exposed;

forming a second insulating layer on said first insulating layer and in said contact hole;

selectively removing a predetermined portion of said second insulating layer including the portion in said contact hole formed in said first insulating layer, thereby forming at least one groove having a predetermined pattern corresponding to a desired interconnection pattern in said second insulating layer, said groove being formed to expose at a bottom thereof said contact hole formed in said first insulating layer;

forming a continuous metallic material layer on a remaining portion of said second insulating layer and in said groove formed in said second insulating layer and in said contact hole of said first insulating layer, said continuous metallic material layer having at least one groove corresponding to said groove in said second insulating layer;

applying an organic polymeric material having a predetermined flowability to said continuous metallic material layer, thereby covering said continuous metallic material layer with said polymeric material so as to form a layer of said polymeric material having a substantially flat surface; and sequentially removing by ion etching said polymeric material layer and said metallic material layer along a direction of thickness thereof until said second insulating layer is exposed, thereby leaving said metallic material in said groove formed in said second insulating layer to provide at least one metallization layer comprising the remaining metallic material and having a surface level which is substantially the same as that of said second insulating layer, said metallization layer being connected to said semiconductor region through said contact hole.

2. A method according to claim 1, wherein said first insulating layer comprises silicon oxide.

3. A method according to claim 1, wherein said first insulating layer comprises a silicon oxide film formed on said semiconductor substrate and a silicon nitride film formed on said silicon oxide film.

4. A method according to claim 1, wherein said second insulating layer comprises phosphosilicate glass.

5. A method according to claim 1, wherein said metallic material comprises a member selected from the group consisting of aluminum and an alloy thereof, platinum, gold, tungsten, molybdenum, titanium and nickel.

6. A method according to claim 1, wherein said polymeric material comprises a member selected from the group consisting of polyimide and photoresist materials.

7. A method according to claim 1, wherein the ion etching is performed by using nonreactive ions.

8. A method according to claim 7, wherein said nonreactive ions comprise a member selected from the group consisting of argon ions, xenon ions, neon ions, and nitrogen ions.

9. The method of claim 1 wherein said groove in said metallic material layer includes a small recess which is retained in said remaining metallic material.

* * * * *